United States Patent Office 3,672,934
Patented June 27, 1972

3,672,934

METHOD OF IMPROVING LINE RESOLUTION IN SCREEN PRINTING

John R. Larry, Wilmington, Del., assignor to E. I. du Pont de Nemours and Company, Wilmington, Del.

No Drawing. Continuation-in-part of abandoned application Ser. No. 886,035, Dec. 17, 1969. This application May 1, 1970, Ser. No. 33,875
Int. Cl. B44d *1/16;* B41m *1/12*
U.S. Cl. 117—38 13 Claims

ABSTRACT OF THE DISCLOSURE

The invention relates to decreasing the wettability of the screen and/or substrate surfaces used in screen printing by treating at least one of said surfaces with a fluorinated organic compound which reduces the surface energy of the treated surface. The object is to coat the surfaces which contact the screen printing paste whereby any spreading of the paste on the substrate is significantly reduced. This process provides a means for screen printing fine line patterns onto conventional substrates as currently demanded in the electronic industry.

CROSS-REFERENCE TO RELATED APPLICATIONS

This is a continuation-in-part of Ser. No. 886,035, filed Dec. 17, 1969, now abandoned.

BACKGROUND OF THE INVENTION

The manufacture of thick film microcircuits involves the deposition of resistive, dielectric, and conductive pastes through a patterned fine mesh screen onto a suitable substrate. Since the present trend is directed towards smaller printed circuits, adequate fine line resolution must be achieved during the printing process. It is essential that a pattern be clearly printed onto a substrate and that once on the substrate, the paste material does not flow beyond the original screen pattern dimensions, thus leading to smearing and poor line definition. It is the object of this invention to provide an improved process of providing precise line definition through screen printing. More particularly, the invention involves a method of screen printing which meets all of the objectives set forth above.

SUMMARY OF THE INVENTION

This invention relates to a method of decreasing the wettability of screen and substrate surfaces used in screen printing comprising treating at least one of said surfaces with a fluorinated organic compound which is capable of being adsorbed to the surface(s) and which reduces the surface energy of the treated surface. More specifically, the invention involves a method of improving line resolution in screen printing by (a) treating the surface of the screen, the substrate or both with a fluorinated organic compound to reduce the surface energy of the treated surface(s); (b) screen printing a desired pattern through a screen onto a substrate, wherein the screen, the substrate or both have been treated in accordance with step (a); and (c) firing the printed substrate to yield a highly resolved printed pattern.

DESCRIPTION OF THE PREFERRED EMBODIMENTS

It has been found that line definition depends to a large extent on the wettability of a printing paste on the screen and on the substrate. Wettability is a function of the surface energy of the printing paste and the surface energy of the materials which the paste contacts (e.g., substrate, screen, etc.). When a screen printing paste is deposited onto a solid substrate, there is generally a well-defined angle of contact, i.e., the angle between the solid-liquid interface and the liquid-air interface as measured through the liquid. The magnitude of this angle is a function of the various surface energies. In general, if the surface energy of the liquid is much less than that of the solid substrate, the contact angle will be very low or zero and the liquid will tend to spread. Conversely, if the liquid has the higher surface energy, it will tend to form a droplet on the substrate and will not spread.

This invention involves the alteration of surfaces which the paste contacts such that there will be reduced paste wetting. The process for lowering the surface energy of high energy surfaces is accomplished by treating the surfaces with a fluorinated organic compound. The fluorinated compound may be placed on the surfaces by any suitable process, e.g., coating, dipping, spraying, brushing, etc. Any fluorinated compound which reduces the surface energy of a treated surface and is capable of being adsorbed onto the surfaces may be used.

Alternatively, such a fluorinated compound may be formed in situ on the surface(s). In this latter approach, for example, a compound having alkoxy silane groups and organic groups that can be protonated to form a salt (salt-forming groups) may be applied to the surface material. After this compound becomes adsorbed on the surface, a fluorinated anionic surfactant may be applied to the surface material. It is believed that in this process silane compound bonds to the surface of the substrate or screen primarily through hydroxyl groups or silicon-oxygen linkages resulting from the hydrolysis of the alkoxy group, wherein the salt-forming groups project out of the surface. When this coated surface is treated with a fluorinated anionic surfactant, the salt-forming groups are protonated and there is a salt formation with the anionic group of the surfactant. The nonpolar tail of the surfactant projects out of the surface, thus giving decreased surface wettability. It is pointed out that while this theory is postulated, this invention is not intended to be limited by such theory.

The particular silane compound utilized can be selected from any of the well known silanes. Silanes having from 1 to 3 alkoxy silane groups are preferred. For optimum adsorption on the surfaces, silanes having three alkoxy groups give best results while those having one alkoxy group have poorer adsorption characteristics. Suitable compounds include gamma-aminopropyltriethoxysilane, delta-aminobutylmethyldiethoxysilane, and mixtures thereof, etc.

Any fluorinated anionic surfactant may be used. While nonpolar tails may be strictly hydrocarbon, fluorocarbon surfactants terminated with a $CF_3$ group will produce the lowest surface energy and thus is the preferred type of anionic surfactant. Ionic groups on the surfactant may include carboxylates, phosphates, sulfates, sulfonates, etc. Suitable surfactants include $$[R-(CF_2CF_2)_nCH_2CH_2O]_m-P{=}O(OH)_{3-m}$$

$$R(CF_2CF_2)_n(CH_2)_2SO_3H$$

$$F(CF_2CF_2)_n(CH_2)_2O(CH_2)_3SO_3Na$$

$$R(CF_2CF_2)_n(CH_2)_2O(CH_2CH_2O)_3SO_3Na$$

wherein R is $CF_3CF_2$, $n$ is 0–6 and $m$ is 1 or 2.

The surfaces treated in accordance with this invention are any and all surfaces which come into contact with the screen printing paste; these include the screen and the substrate material. Treating one or the other greatly improves line resolution. However, even better line resolution is achieved when the screen and the substrate are treated. The improved resolution results from the decreased adhesion to the screen thus allowing a well defined column of paste to be deposited on the substrate surface. Once on the substrate, the decreased wettability prevents closely spaced lines from flowing together.

The following examples are presented to further illustrate the invention. In the examples and elsewhere in the specification, all parts, percentages and proportions of materials or components are by weight.

Example 1

Equal molar amounts of $CF_3(CF_2)_6COCl$ and $$H_2N(CH_2)_3Si(OC_2H_5)_3$$

were reacted to form a fluorinated compound having the formula $CF_3(CF_2)_6CONH(CH_2)_3Si(OC_2H_5)_3$. This compound was dissolved in tetrahydrofuran which contained about 1% water. An alumina chip (1 inch square and .025 inch thick) was dipped into the solution for about 1 minute. The surface of the chip was then thoroughly rinsed with distilled water and dried. Prior to treatment, the contact angle of a drop of beta-terpineol on the alumina chip was less than 10°. After treatment, the contact angle was about 70°, thus showing the significant reduction in the spreading of the beta-terpineol.

Example 2

An alumina chip was dipped into a 1% aqueous solution of gamma-aminopropyltriethoxysilane for 2 minutes. The surface was thoroughly rinsed with distilled water and placed into a dilute acidic aqueous solution of $$CF_3(CF_2)_6CH_2CH_2OP{=}O(OH)_2$$

(surfactant). The surface was again thoroughly rinsed with distilled water and dried. Prior to the treatment, a drop of beta-terpineol had a contact angle of less than 10°; after treatment, a drop of beta-terpineol had a contact angle of 80°, thus showing a significant improvement obtained by the process of this invention.

Example 3

A metallizing composition contained 80% finely divided gold, 6% finely divided glass (62% PbO, 19% $B_2O_3$, 8% $SiO_2$, 6% CdO, 3% NaF) and 14% liquid vehicle (8% ethyl cellulose, 92% beta-terpineol) was screen printed through a screen which had been treated, as described in Example 2, onto the substrates treated in accordance with Examples 1 and 2. Prior to treating the screen and substrate, a drop of the metallizing composition had a contact angle of 41° on the substrate; after the screen and substrate had been treated, a drop of the metallizing composition had a contact angle of 88°. The screen pattern comprised 10 mil lines spaced 5 mils apart, 5 mil lines spaced 5 mils apart and 6 mil lines spaced 4 mils apart. After printing, the substrate was fired at 760° C. for 5 minutes. All of the lines were clearly resolved and exhibited clearly defined conductive areas. In contrast, when the same metallizing composition was printed with an untreated screen and untreated substrate, all of the lines spread. In the case of the 6 mil lines and 5 mil lines, most of the spacings had been filled with the metallizing composition and the lines were poorly resolved.

The process of this invention involving the treating of surfaces is applicable to any well known materials, e.g., glass, ceramic, steel, polyvinyl alcohol-coated substances, plastics, etc. The improved screen printing process is also applicable to the deposition conventional screen printing compositions including conductor compositions, resistor compositions, dielectric compositions and other electronic printable compositions. The particular conductive, resistive, dielectric or liquid vehicle material utilized is not a critical feature of the improved printing process of this invention.

I claim:

1. A method of decreasing the wettability of one or more of the screen and substrate surfaces used in screen printing comprising treating at least one of said surfaces with a silane and then with a fluorinated anionic surfactant, to reduce the surface energy of the treated surface(s).

2. A method in accordance with claim 1 wherein both the screen and the substrate are treated.

3. A method in accordance with claim 1 wherein the treating is carried out by applying a fluorinated compound which is the reaction product of a silane and a fluorinated anionic surfactant.

4. A method according to claim 1 wherein said surfactant is terminated with a $—CF_3$ group.

5. A method according to claim 1 wherein said silane has from one to three alkoxy groups thereon.

6. A method according to claim 5 wherein said surfactant is terminated with a $—CF_3$ group.

7. A method of decreasing the wettability of screen and substrate surfaces used in screen printing comprising applying a silane to the surface(s) followed by applying a fluorinated anionic surfactant designated by the formula $$[CF_3CF_2(CF_2—CF_2)_nCH_2CH_2O]_m—P{=}O(OH)_{3-m}$$

wherein *m* is 1 or 2 and *n* is 0–6, and said silane contains functional groups capable of bonding with the surfactant.

8. A method in accordance with claim 7 wherein the silane is selected from the group consisting of gamma-aminopropyltriethoxysilane, delta - aminobutylmethyldiethoxysilane and mixtures thereof.

9. A method of improving line resolution when screen printing onto a substrate comprising:

(a) treating at least one of the surfaces of the screen and the substrate with a fluorinated organic compound to reduce the surface energy of the treated surface(s);

(b) screen printing a desired pattern through a screen onto a substrate, wherein the screen, the substrate or both have been treated in accordance with step (a); and (c) firing the printed substrate to yield a highly resolved printed pattern.

10. A method in accordance with claim 9 wherein both the screen and the substrate are treated.

11. A method in accordance with claim 9 wherein the treating is carried out by applying a fluorinated compound which adheres to the surface(s) being treated.

12. A method in accordance with claim 9 wherein the treating step comprises applying silane to the surface(s) followed by applying a fluorinated anionic surfactant designated by the formula $$[CF_3CF_2(CF_2—CF_2)_nCH_2CH_2O]_m—P{=}O(OH)_{3-m}$$

wherein *m* is 1 or 2 and *n* is 0–6, and said silane contains functional groups capable of bonding with the surfactant.

13. A method in accordance with claim 12 wherein silane is selected from the group consisting of gamma-aminopropyltriethoxysilane, delta - aminobutylmethyldiethoxysilane and mixtures thereof.

References Cited

UNITED STATES PATENTS

| | | | |
|---|---|---|---|
| 3,404,023 | 10/1968 | Schrader et al. | 117—69 |
| 3,341,563 | 9/1967 | Buchheit et al. | 117—47 |
| 3,096,207 | 7/1963 | Cohen | 260—955 |

FOREIGN PATENTS

| | | | |
|---|---|---|---|
| 971,585 | 9/1964 | Great Britain | 260—955 |

ALFRED L. LEAVITT, Primary Examiner

M. F. ESPOSITO, Assistant Examiner

U.S. Cl. X.R.

117—35.5, 45, 47 R, 62, 69